United States Patent [19]

Beasom

[11] Patent Number: 4,713,681
[45] Date of Patent: Dec. 15, 1987

[54] STRUCTURE FOR HIGH BREAKDOWN PN DIODE WITH RELATIVELY HIGH SURFACE DOPING

[75] Inventor: James D. Beasom, Melbourne Village, Fla.

[73] Assignee: Harris Corporation, Melbourne, Fla.

[21] Appl. No.: 48,482

[22] Filed: May 5, 1987

Related U.S. Application Data

[63] Continuation of Ser. No. 739,844, May 31, 1985, abandoned.

[51] Int. Cl.[4] .............................................. H01L 29/34
[52] U.S. Cl. ..................................... 357/52; 357/23.4; 357/23.8; 357/49; 357/53
[58] Field of Search ...................... 357/23.4, 23.8, 52, 357/53, 49

[56] References Cited

U.S. PATENT DOCUMENTS

| | | | |
|---|---|---|---|
| 3,341,857 | 9/1967 | Kabell . | |
| 3,405,329 | 10/1968 | Loro | 357/53 |
| 3,446,995 | 5/1969 | Castrucci | 357/53 X |
| 3,463,977 | 8/1969 | Grove | 357/235 |
| 3,600,647 | 8/1971 | Gray | 357/23.8 |
| 3,631,312 | 12/1971 | Moyle et al. . | |
| 3,767,981 | 10/1973 | Polata | 317/235 R |
| 3,836,998 | 9/1974 | Kocsis et al. . | |
| 3,845,495 | 10/1974 | Cauge | 357/23 |
| 3,849,789 | 11/1974 | Cordes et al. . | |
| 3,912,545 | 10/1975 | Armstrong . | |
| 4,163,984 | 8/1979 | Pucel . | |
| 4,190,850 | 2/1980 | Tihanyi | 357/23.4 |
| 4,242,697 | 12/1980 | Berthold | 357/49 |
| 4,290,078 | 9/1981 | Ronen . | |
| 4,300,150 | 11/1981 | Colak . | |
| 4,376,286 | 3/1983 | Lidow | 357/23.4 |

*Primary Examiner*—Martin H. Edlow
*Attorney, Agent, or Firm*—Barnes & Thornburg

[57] ABSTRACT

A high voltage PN junction in which a surface layer of the more lightly doped side of the junction, adjacent to the heavily doped side of the junction, is doped more heavily than the rest of that region and with the same conductivity type. The increased doped region is formed so that an overlying field plate totally depletes it before critical field for avalanche is reached.

37 Claims, 12 Drawing Figures

STRUCTURE FOR HIGH BREAKDOWN PN DIODE WITH RELATIVELY HIGH SURFACE DOPING

This is a continuation of application Ser. No. 739,844, filed May 31, 1985, now abandoned.

BACKGROUND AND SUMMARY OF THE INVENTION

The present invention relates generally to high voltage surface PN junctions and more specifically to an improved PN junction in a high doping surface.

Generally in semiconductor devices, a higher impurity concentration region is formed in the surface of a second region of opposite conductivity type and lower impurity concentration to form a PN junction. The surface of the substrate is usually covered with an insulative and protective layer. When these junctions are reverse biased, a depletion region is formed extending substantially into the lighter doped region. An electric field exists across the depletion region with its intensity higher in the vicinity of the surface. This results in a lower breakdown voltage for this region and thereby reduces the overall breakdown voltage of the PN junction.

In an effort to increase the breakdown voltage of the PN junction, it has been suggested in U.S. Pat. No. 3,463,977 to Grove et al. to provide field plates extending from the high impurity concentration region out across the low impurity concentration region along the surface. The field plates create an inverted region below the field plates which in itself will also reduce the breakdown characteristics of the junction if the reverse bias is large enough. To minimize this, Grove suggests increasing the thickness of the insulative layer below the field plate such that the breakdown voltage of the inverted region is not exceeded by the reverse biasing of of the PN junction. Grove also recognizes that the depletion layer thickness of the field induced junction increases with decreasing surface concentration. Thus, he recommends keeping the surface concentration as low as possible.

In high voltage applications including field plates, the thickness of the oxide must be carefully designed. As described in U.S. Pat. No. 3,767,981 to Polata, for a field plate to be effective, the insulation layer must be relatively thin while structures having high breakdown voltage require a relatively thick oxide layer between any charge carrying conductor in the substrate. Polata describes a tapered oxide layer extending from the junction outward as an optimization of both these requirements. Table 1 of Polata illustrates the relationship between the impurity concentration, critical electric field at which avalanche breakdown occurs, the magnitude of the electric field change from the surface, the maximum depletion layer and the maximum voltage that a one-sided junction can support. As can be seen with the increase of impurity concentration, the critical field increases, the rate of change of electrical field increases, maximum depth of the depletion region decreases and the maximum voltage at the junction can support decreases.

FIG. 2 illustrates a device similar to the one disclosed in Grove et al. It is a P+ N− diode having an N− region 20 with a P+ region 22 in its surface. An insulative protective layer 24 is formed on the surface and a field plate 26 is provided. When the PN junction 20, 22 is reverse biased, a depletion region 28 is formed extending from the PN junction 30. Electric field lines 32 are shown within the depletion region 28. As can be seen, the field plate 26 substantially modifies the horizontal component and spreads the vertical component of the electric field along the surface away from the surface portion of the PN junction 30.

The general variation of the vertical component of the electric field extending from the depleted portion 28 of the N− region 20 through the insulator 24 to the field plate 26 is shown in FIG. 3. The region where the electric field is highest is in the substrate at its surface and decreases monotonically away from the surface.

In some applications, it is very desirable to form a relatively high impurity concentration region in the surface of the semiconductor substrate having the same conductivity type as the substrate. Such a device is illustrated in FIG. 1 wherein the N region 34 has a higher impurity concentration than the N−substrate 20 in which the P region 22 is formed. As illustrated by the depletion region 28 and electric field lines 32, he electric field lines 32 are increased where the N region 34 abuts the curved portion of P region 22. This reduces the breakdown voltage for the junction 30 at the surface. To maintain high voltage junctions, the prior art spaced the N+ region 34 from the P region 22. This required additional steps to produce this separation.

Thus, it is an object of the present invention to maintain a high sustained reverse breakdown voltage while allowing the formation of a non-selective, high impurity concentration region on the low impurity side of a PN junction.

Another object of the present invention is to provide an improved lateral high voltage insulated gate field effect transistor device.

Yet another object of the present invention is to provide an improved double diffused lateral high voltage insulated gate field effect transistor.

Still another object of the present invention is to provide a high voltage lateral bipolar transistor having a punch-through shield.

A further object of the present invention is to provide a high voltage, low collector resistance, vertical bipolar transistor.

An even further object of the present invention is to provide a high CEO bipolar transistor and a high impurity concentration surface region.

These and other objects of the invention are attained by providing a field plate separated from the surface of the lighter doped side of a PN junction and a higher impurity concentration region at the surface of the lighter doped side of the same conductivity type and extending down along a substantial portion of the higher doped side of the PN junction. The impurity concentration of the lighter doped side of the PN junction including its higher impurity concentration surface region is selected so that the surface region is depleted by biasing the field plate before critical field is reached therein. The PN junction may be the body-drain junction of the double diffused lateral MOS transistor, the junction of the source and drain regions with the body of a lateral insulator field effect transistor, the collector-base junction of a lateral bipolar transistor, or the base-collector junction of a vertical bipolar transistor.

DETAILED DESCRIPTION OF THE DRAWINGS

Figure 1:
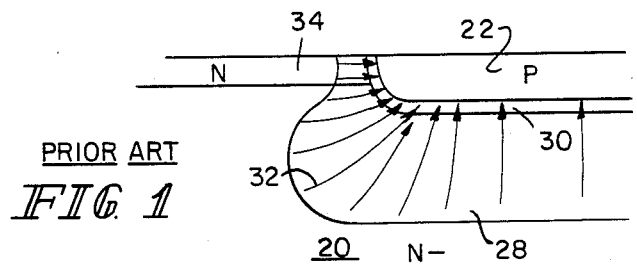
FIG. 1 is a cross-sectional view of the PN junction of the present invention having a surface region of high impurity concentration than the lighter dope side of the PN junction.
Figure 2:
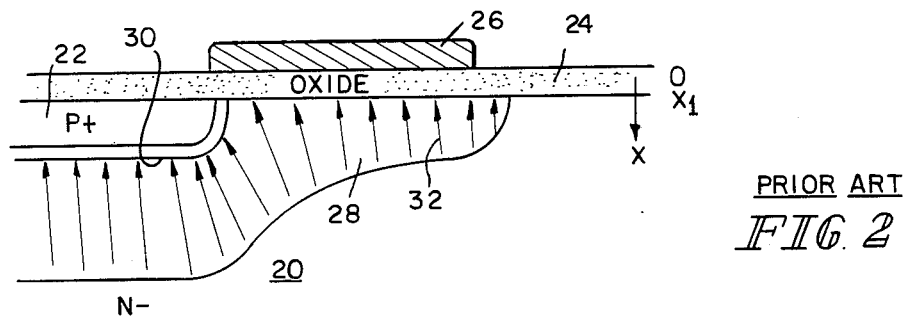
FIG. 2 is a cross-section of a PN junction of the prior art having a field plate.
Figure 3:
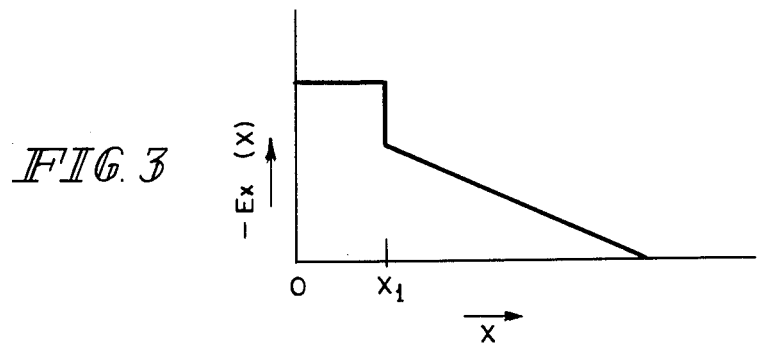
FIG. 3 is a graph of electric field versus depth from the field plate.
Figure 4:
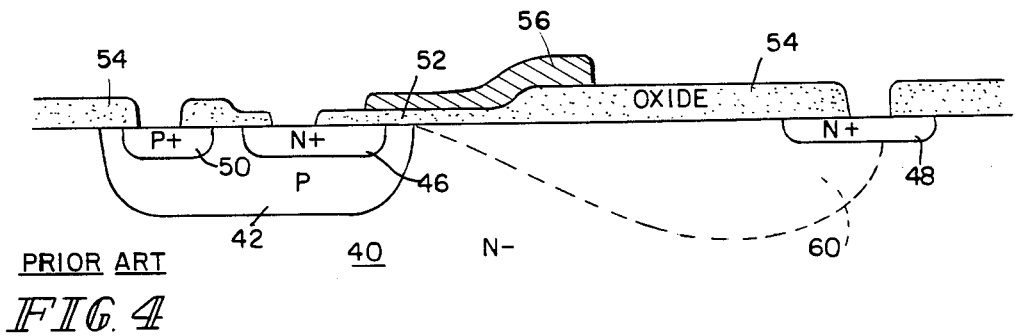
FIG. 4 is a cross-sectional view of a lateral insulated gate field effect transistor of the prior art.

One device which is improved by the present invention is a lateral double diffused insulated gate field effect transistor as illustrated in FIG. 4. An N− drain region 40 has a P body region 42 formed therein. An N+ source region 46 is formed in the body region 42. An N+ drain contact region 48 is formed in the drain 40 and a P+ body contact region 50 is formed in the P+ body 42. A thin gate oxide region 52 extends over the body portion 42 between the N+ source region 46 and the N− drain region 40. The remainder of the surface is covered by a field oxide 54. A gate 56 lies over the portion of body region 42 between the source contact 46 and the drain region 40.

In the transistor of FIG. 4, current flows from the source region 46 across the body surface region 42 in a gate induced inversion layer into the lightly doped N− drain region 40. The current then flows through the bulk resistance of the N− drain region shunted by gate induced accumulation region in the lateral part of the N− region 40 overlayed by the gate and continues to the N+ drain contact region 48. The current enters the N− drain region 40 from the body region 42 in a very narrow layer at the semiconductor surface and gradually spreads vertically as it moves towards the drain contract region 48. The path of the drain current is illustrated as region 60 in FIG. 4 bound by a cross-hatched line.

The on-resistance of the transistor of FIG. 4 is the total resistance of the path of the N+ drain contact 48 to the N+ source region 46. As a consequence of the shape of the current flow path 60, the doping of the drain surface adjacent to the body 40, where current flows from the body surface into the drain, has a major impact on the on-resistance.

Figure 5:
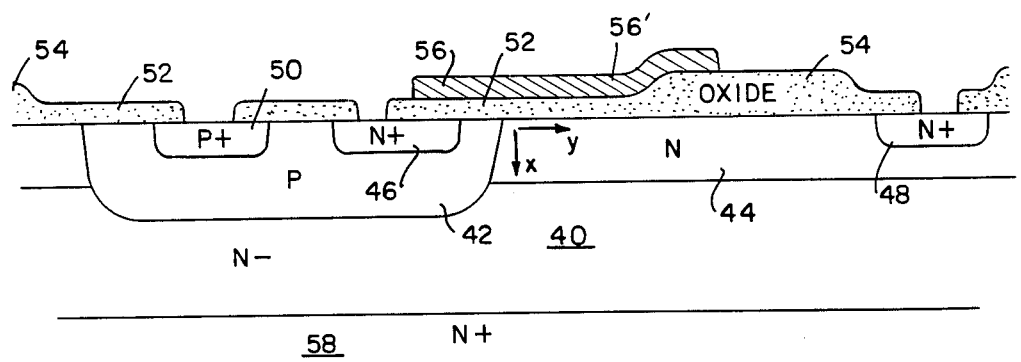
FIG. 5 is a cross-sectional view of a lateral insulated gate field effect transistor incorporating the principles of the present invention.

An improved insulated field effect transistor compared to that of FIG. 4 is illustrated in FIG. 5 incorporating the principles of present invention. The N− source region 40 is shown as including a higher impurity concentration in region 44 at the surface. N− region 44 substantially reduces the on resistance compared to the prior device of FIG. 4. The gate region 56 is modified at 56' to extend past the body region 42 along the drain region 44 substantially to the N+ drain contact region 48. The extended gate acts as a field plate to reduce the electric field in the higher impurity N region 44 while taking advantage of the increased critical field which results from the higher impurity concentration region 44. The doping profile of region 44 is selected such that when the PN junction 42-44, 40 is reversed biased, the depletion layer extending from the P body region 42 into the drain regions 40 and 44 as modified at the surfaces by the field plate 56, extends entirely through the surface layer 44 before critical field is reached in layer 44. It continues to spread through the underlying N− source region 40 until critical field is reached in the surface layer 44 where the field is the highest or in the underlying region of the lower doped region 40 where the critical field is lower. An optimum structure for the surface layer is one in which the critical field doping dependency matches the decrease of actual field with distance from the surface, such that critical field is reached over an extended region in the drain regions 40 and 44 at the same applied voltage rather than at a point as in the case of prior art.

In the preferred embodiment, the surface layer 44 of higher impurity concentration is formed in the entire surface rather than being restricted to a portion of the surface. This allows a layer to be formed with no masking step which reduces the process cost and defects are reduced leading to improved yield. The surface layer 44 may be formed as separate distinct layer in region 40 using single or multiple ion implantations. An epitaxial process can also be used to form the graded surface doping. A Gaussian profile may be formed by a conventional diffusion process. The N-region 40 may also be a layer on an N+ substrate region 58.

As an alternative, the high impurity concentration surface layer 44 may be selectively formed using masking. This surface region would extend from region 42 substantially toward surface contact 48. As noted in the analysis of FIGS. 1-4, it is this region which the combination of the field plate and high imurity surface layer has its major impact in high voltage integrated circuits.

A comparison of the electrical field and voltages of the uniform impurity concentration drain region of FIG. 4 with the decreasing impurity concentration region of FIG. 5 follows. The uniform concentration drain region is described in detail in Polata U.S. Pat. No. 3,767,981. The slope of the magnitude of the electrical field in the depletion area of a uniform impurity concentration region is defined as $$\frac{dE}{dx} = \frac{q N_c}{\epsilon_{si}} \quad (1)$$

For an exponential approximation of a Gaussian profile, the equation is $$\frac{dE}{dx} = \frac{q}{\epsilon_{si}} (N_s e^{-4x} + N_c) \quad (2)$$

where
q = electric charge
$N_c$ = background doping concentration
$N_s$ = surface doping concentration
$\epsilon_{si}$ = dielectric constant of silicon $\alpha$ = grading constant
Integrating, equation (2) provides $$E(x) = E(0) + \frac{q}{\epsilon_{si}}\left[-\frac{N_s}{\alpha}(e^{-\alpha x} - 1) + N_c x\right].$$

At the depletion layer edge $x_2$, $E(x)=0$, thus $$E(0) = -\frac{q}{\epsilon_{si}}\left[-\frac{N_s}{\alpha}(e^{-\alpha x_2} - 1) + N_c x_2\right].$$

Integrating $E(x)$ from 0 to $x_2$ one obtains the voltage drop in the silicon:

$$V_{si} = -x_2 E(0) - \frac{q}{\epsilon_{si}}\left[-\frac{N_s}{\alpha 2}(e^{-\alpha x_2} - 1) + \frac{N_s x_2}{\alpha} + \frac{N_c x_2^2}{2}\right]$$

A portion of the voltage also occurs in the insulator between the field plate and the depleted silicon. This voltage is given by $V_{ox} = E_{ox} t_{ox}$ where $E_{ox}$ = field in oxide and $$E_{ox} = \frac{\epsilon_{si}}{\epsilon_{ox}} E(0)$$

using the well known boundry condition for normal electric field at a boundary between media of different dielectric constants and where
$\epsilon_{si}$ = dielectric constant of silicon
$\epsilon_{ox}$ = dielectric constant of insulator
$t_{ox}$ = thickness of insulator
thus we have $$V_{ox} = \frac{\epsilon_{si}}{\epsilon_{ox}} E(0) t_{ox}$$

and the total voltage is $$V_{applied} = V_{si} + V_{ox}$$

A device as in FIG. 5 was built having the following parameters:
$N_c = 5 \times 10^{13}$ atoms per cubic centimeter
$N_s = 2.1 \times 10^{15}$ atoms per cubic centimeter
$x_j = 10.6$ microns (depth of surface layer 44)
$t_{ox} = 5 \times 10^{-5}$ cm adjacent to junction
$t_{ox} = 3 \times 10^{-4}$ cm at field plate edge
For $N_c = 5 \times 10^{13}$, $E_{crit} = 2 \times 10^5$ V/cm. Taking $E(10.6$ microns$) = 2 \times 10^5$, $E(O) = 2.96 \times 10^5$ but $E_{crit} = 3.2 \times 10^5$ for $N_s = 2 \times 10^{15}$ atoms per cubic centimeter which is the surface doping for the N layer in this example. Thus, the calculation shows that one is able to operate at $E_{crit}$ in the original substrate while not exceeding $E_{crit}$ at the surface for this profile.

Using the above equations and example, one can also calculate the voltage difference between undepleted N— and field plate necessary to deplete the surface layer. That voltage is $$V = V_{ox} + V_{si} = 14\ V + 27\ V = 41\ V$$

This is much less than the planar junction breakdown into a uniform background of $2 \times 10^{15}$ atoms per cubic centimeter (the N layer surface concentration) of 104 V. This calculation shows that the field plate will totally deplete the N layer 44 before the increased surface concentration due to the N layer 44 can cause breakdown.

It should be noted that although FIG. 5 shows the gate 56' extending substantially over the drain region 40, 44 between the body region 42 and the drain contact region 48, it may extend totally to the drain contact 48. This will provide an accumulation layer across the entire high resistivity N— drain region 40 for a minimum on-resistance. In constrast to FIG. 4, the conventional high voltage lateral insulated gate field effect transistor has a gate which extend over a portion of the N— source region 40 near the body 42 thereby leaving the N— drain region 40 near the drain contact region 48 ungated in order to achieve the required breakdown voltage.

An improved low voltage insulated gate field effect transistor may be formed in an integrated circuit with and using the same process steps used to form the improved high voltage devices of FIG. 5. The N— body region 62 FIG. 6 includes a high impurity surface region 64 in which P+ source and drain regions 66 and 68 are formed. The source and drain regions have a shallower depth than the high impurity concentration N region 64. A gate oxide 70 and field oxide 72 are formed on the surface and a gate 74 is formed over the gate oxide 70. The high impurity surface region 64 is the same as 44 in FIG. 5 and the source and drains 66 and 68 are the same as body contact 50. The improvement is achieved by forming the source and drain region 66, 68 shallower than the surface layer 64 such that the surface layer 64 doping at the bottom of the source and drain region 66 and 68 is sufficiently higher than the N— doping of the body 62. The higher doping reduces the depletion widths, allowing smaller drain-source spacing for a given punch-through voltage. Smaller drain-source spacing provides faster switching time, greater device conductance and lower on-resistance for a given area device. Reduced spacing for a given punch-through voltage also allows adjacent devices to be placed closer together with reduced circuit area and less cost.

Figure 7:
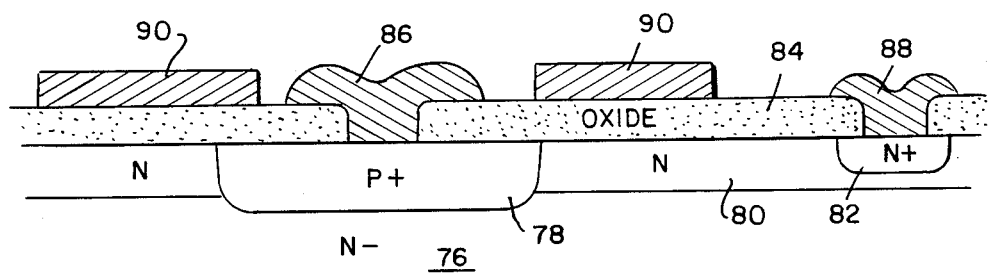
FIG. 7 is a cross-sectional view of a PN junction incorporating the principles of the present invention.

A more generic PN junction incorporating the present invention is illustrated in FIG. 7 wherein an N— substrate 76 forms a PN junction with P+ region 78. A high surface impurity concentration N region 80 extends along the surface of 76 and includes a surface N+ cathode contact region 82. A field oxide layer 84 is on the surface contact 86 is made to the P+ anode 78 and a contact 88 is made to the N+ cathode contact region 82. A field plate 90 extends about the cathode anode junction along the surface of the N+ concentration region 80.

Figure 6:
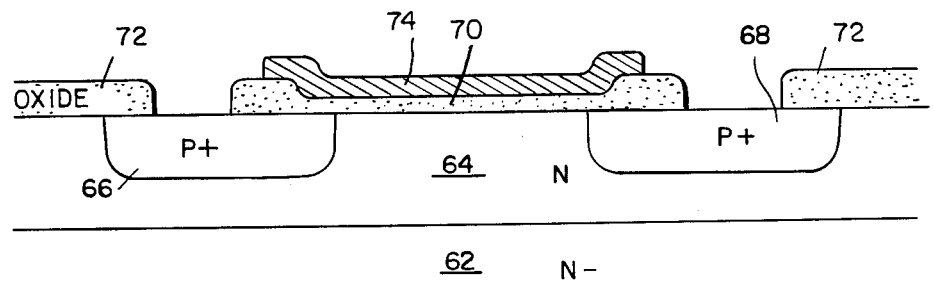
FIG. 6 is a cross-sectional view of another lateral insulated gate field effect transistor incorporating the principles of the present invention.
Figure 8:
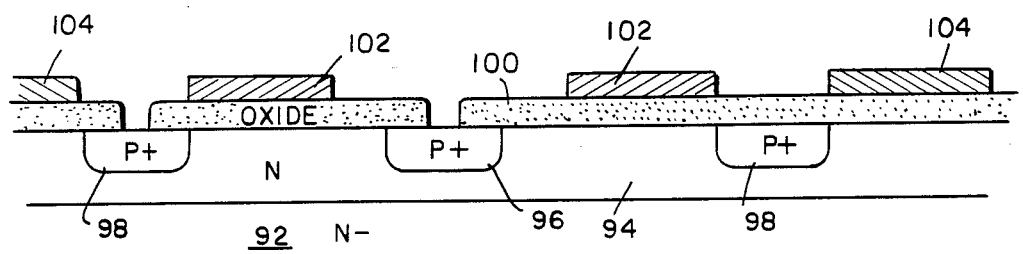
FIG. 8 is a cross-sectional view of a lateral bipolar transistor incorporating the principles of present invention.

In a similar application to the lateral P channel device of FIG. 6, the present invention is also applicable to lateral bipolar transistors as illustrated in FIG. 8. An N— base region 92 has a higher impurity concentration surface N region 94 thereon. A P+ emitter region 96 is formed in the N region 94 as is a P+ collector ring 98.

A surface oxide 100 separates the field plates 102 and 104 which are rings extending laterally from the collector ring 98 in both directions. It should be noted that although the collector and emitters are shown shallower than the high impurity concentration region 94, the collector region 98 if desired may extend down into the lower impurity concentration region 92. The high impurity concentration surface region 94 acts as a punch-through shield and the field plates results in a high-base collector breakdown voltage. As mentioned above, by forming the collector deeper than the high impurity concentration region 94 and specifically as a deep graded collector region, further performance improvements can be obtained.

Figure 9:
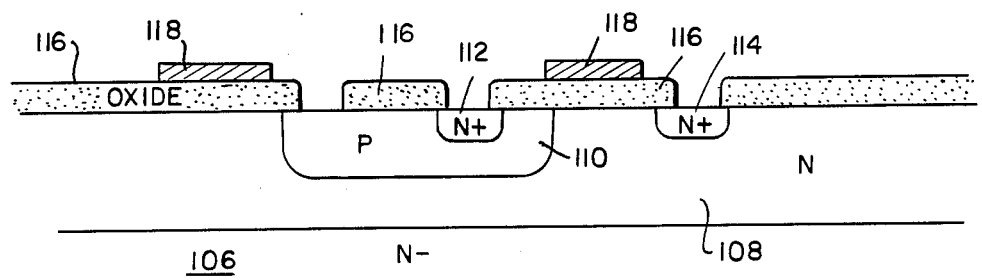
FIG. 9 is a cross-sectional view of a vertical bipolar transistor incorporating the principles of present invention.

The present invention is also applicable to vertical bipolar transistors resulting in a reduced collector resistance as illustrated in FIG. 9. The N− collector region 106 has a high impurity concentration N region 108 at its surface. The P base region 110 is formed in the high impurity concentration region 108 and N+ emitter region 112 is formed in the base 110. Collector N+ contact region 114 is formed in the high impurity concentration region 108. A surface oxide 116 separates the field plate 118 from the surface high impurity concentration region 108. The field plate 118 extends from the base region 110 towards the collector contact region 114. It should be noted that the P base region 110 is shallower than the high impurity concentration region 108 producing a region of increased impurity concentration below the base. This region together with the entire N layer 108 between the base 110 and collector contact 114 provides a low resistance path for collector current flow.

Figure 10:
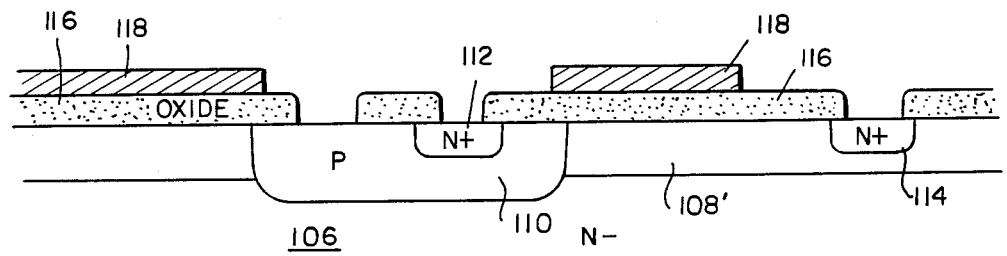
FIG. 10 is a cross-sectional view of even another bipolar vertical bipolar transistor incorporating the principles of the present invention.

In some applications, a high collector-emitter breakdown voltage ($V_{CEO}$) is required in combination with low collector resistance for low voltage devices. Such a device is illustrated in FIG. 10, wherein the high impurity concentration region 108' is shallower than FIG. 9 such that the P base region 110 extends into the N− collector region 106. In this way, the doping in the collector beneath the projection of the emitter-base junction into the collector-base junction is unmodified by the high impurity surface region 108'. Thus, the collector emitter breakdown voltage, which is determined by the previously mentioned projection, is maintained at its high value.

Although the field plate 118 in FIGS. 9 and 10 is shown as extending over a portion of the base region 110, it could be displaced from the base-collector surface junction and the base contact (not shown) would include an extended portion extending from the base region 110 over the adjacent portion of the high impurity concentration region 108 and 108'. The extended base contact portion and the field plate act as the field plate illustrated in FIGS. 9 and 10. This is just an example of the many configurations of field plate 118 which may comprise one or more conductors.

Figure 11:
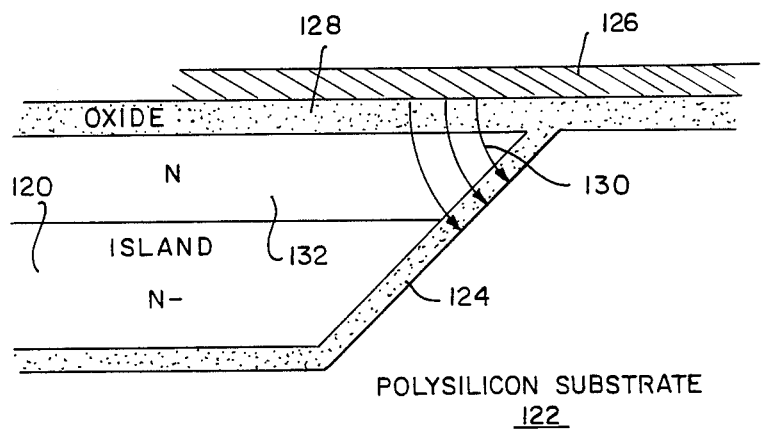
FIG. 11 is a cross-sectional view of a dielectrically isolated island incorporating the principles of the present invention.

Other advantages result from the present process to solve high voltage problems. In dielectrically isolated islands, voltage breakdown at the corners occur. As illustrated in FIG. 11, semiconductor island 120 is separated from a polycrystalline substrate 122 by a dielectric 124. A conductor 126 carrying a high voltage with respect to the poly substrate extends across the substrate and island and is separated by an insulative layer 128. Field lines 130 show the source of the breakdown at the corners without a surface region 132. By providing the high impurity concentration region 132 of the same conductivity type as the island 120, the voltage breakdown capability at the corner is increased. The impurity concentration profile of surface region 132 decreases from the surface such that it is totally depleted before critical field in it is reached. This will allow building active regions in the island 120 closer to the outer edge and, thus, increase density.

Figure 12:
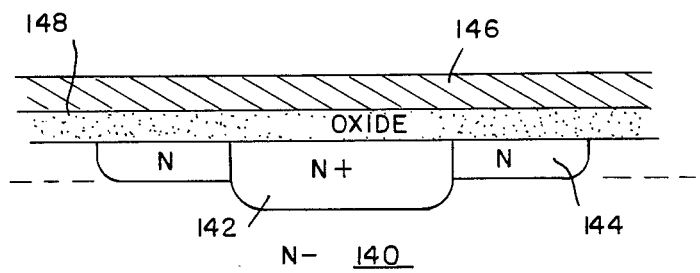
FIG. 12 is a cross-sectional view of a conductor and high impurity surface region incorporating the principles of the present invention.

FIG. 12 illustrates a high impurity N+ region 142 in an N-substrate 140. N+ region 142 may be a channel stop or surface contact region. An N region 144 having a higher impurity concentration than the substrate 140 and lower impurity concentration that N+ region 142 is provided at the surface junction of these two regions to reduce the avalanche carrier generation due to the field induced by conductor 146 being at a large voltage relative to the N− substrate 140. Region 144 would be formed as a non-selective surface layer, as indicated by the dashed lines, in the same step as any of the previously described high impurity concentation surface regions.

The fundamental embodiment of all the embodiments is the formation of a high voltage PN junction in which a surface layer of the more lightly doped side of the junction, adjacent to the heavily doped side of the junction, is doped more heavily than the rest of that region with the same conductivity type and a field plate extends over the surface layer. The impurity concentration profile of the lighter doped side of the junction is formed so that an overlying field plate totally depletes it before critical field for avalanche is reached in the heavier doped portion of the lightly doped side of the junction. Although most all the embodiments illustrate the P side as the higher doped side of the junction, the same principal will apply if the P side is the more lightly doped side of the junction. As discussed previously, the high impurity surface layer may be a selective region extending from the junction of interest. Also, the field plate may be a plurality of field plates. These field plates may be extensions of surface contact conductors.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A high voltage PN junction comprising:
   a first semiconductor region of a first conductivity type having a surface;
   a second semiconductor region of a second conductivity type in said surface;
   a field plate separated from said surface by a layer of insulation and extending laterally across said surface from the surface junction of said first and second regions over said first region;
   the impurity concentration of said first region decreasing from said surface having a high impurity concentration region at said surface and extending down along a substantial portion of the depth of said second region greater than the depth of and having a higher charge density than a surface accumulation region and a low impurity region adjacent the bottom of said second region so that said high impurity concentration region under said field plate is depleted by biasing said field plate before a critical field is reached in the portion of said high impurity concentration region under said field plate.

2. A high voltage PN junction according to claim 1, wherein said impurity concentration profile being such that critical field is reached in said high and low impurity concentration regions substantially simultaneously with said field plate biased.

3. A high voltage PN junction according to claim 1, wherein said first region has a Gaussian impurity profile.

4. A high voltage PN junction according to claim 1, wherein said high impurity concentration region is a substantially constant impurity concentration region formed along the surface of a substantially constant impurity concentration low impurity region.

5. A high voltage PN junction according to claim 1, wherein said second region has a greater depth than said high impurity concentration region.

6. A high voltage PN junction according to claim 1, wherein said high impurity concentration region has a greater depth than said second region.

7. A high voltage PN junction according to claim 1, wherein said second region is a body of a lateral insulated gate field effect transistor, said first region is a drain of said transistor, said high impurity concentration region extends from said body substantially to a surface drain contact, said field plate is an extension of the gate of said transistor and including a source region in said body region.

8. A high voltage PN junction according to claim 1, wherein said first region is the base of a lateral bipolar transistor, said second region is a collector of said transistor, said high impurity concentration region extends at least between said collector and an emitter region in said base region.

9. A high voltage PN junction according to claim 8, wherein said high impurity concentration region has a greater depth than said collector region.

10. A high voltage PN junction according to claim 8, wherein said field plate extends from said collector and over a substantial portion of said high impurity concentration region between said collector and emitter regions.

11. A high voltage PN junction according to claim 1, wherein said second region is a base of a vertical bipolar transistor, said first region is a collector of said transistor, said high impurity concentration region extends from said base substantially to a surface collector contact.

12. A high voltage PN junction according to claim 11, wherein said high impurity concentration region has a greater depth than said base.

13. A high voltage PN junction according to claim 11, wherein said base has a greater depth than said high impurity concentration region.

14. A high voltage PN junction according to claim 1, wherein said second region has a greater impurity concentration than said first region.

15. A high voltage PN junction according to claim 1, wherein said second region has a greater impurity concentration than said low impurity concentration region of said first region.

16. A high voltage PN junction according to claim 1, wherein the high voltage PN junction is in an integrated circuit including a lateral insulated gate field effect transistor, said transistor has a body of the same characteristics as said first region, a source and drain region of said second conductivity type spaced in said body and having the same characteristics as said second region and a gate separated from said body by a layer of insulation and extending over the portion of said body which extends between said source and drain regions.

17. A lateral insulated gate field effect transistor according to claim 16, wherein said high impurity concentration region has a greater depth than said source and drain regions.

18. A high voltage PN junction according to claim 16, wherein said insulative layer is thicker adjacent to said source and drain regions than in the area between said source and drain regions, said field plate forming a gate over said thinner insulative region and a field plate over said thicker insulative region.

19. A lateral insulated gate field effect transistor comprising:
a drain region of a first conductivity type having a surface and a drain contact region on said surface;
a body region of a second conductivity type in said surface;
a source region of said first conductivity type in said body region and said surface;
a field plate and gate separated from said surface by a layer of insulation and extending laterally from said source region across said body region and across a substantial portion of said drain region between said body and drain contact regions;
the impurity concentration of said drain region decreases from said surface having a high impurity concentration region at said surface and extending down along a substantial portion of said body region and a low impurity concentration region adjacent the bottom of said body region so that said high impurity concentration region under said field plate is depleted by biasing said field plate before a critical field is reached in the portion of said high impurity concentration region under said field plate.

20. A lateral insulated gate field effect transistor according to claim 19, wherein said impurity concentration profile being such that critical field is reached in said high and low impurity concentration regions substantially simultaneously with said gate biased.

21. A lateral insulated gate field effect transistor according to claim 19, wherein said drain region has a Gaussian impurity profile.

22. A lateral insulated gate field effect transistor according to claim 19, wherein said high impurity concentration region is a substantially constant impurity concentration region formed along the surface of a substantially constant impurity concentration low impurity region.

23. A lateral insulated gate field effect transistor according to claim 19, wherein said body region has a greater depth than said high impurity concentration region.

24. A lateral insulated gate field effect transistor according to claim 19, wherein said gate extends over said body region and adjacent portions of said drain region and including a field plate spaced from said gate, separated from said surface by said layer of insulation and extending over said portions of drain region between said body and drain contact regions.

25. A high voltage lateral bipolar transistor comprising:
a base region of a first conductivity type and having a surface;

an emitter and collector region of a second conductivity type spaced in said surface;

a field plate separated from said surface by a layer of insulation and extending laterally from said collector region across said base region;

the impurity concentration of said base region decreases from said surface having a high impurity concentration region at said surface and extending down along a substantial portion of the depth of said emitter and collector regions greater than the depth of and having a higher charge density than a surface accumulation region and a low impurity concentration region adjacent the bottom of said emitter and collector regions so that said high impurity concentration region under said field plate is depleted by biasing said field plate before a critical field is reached in the portion of said high impurity concentration region under said field plate.

26. A high voltage lateral bipolar transistor according to claim 25, wherein said high impurity concentration region has a depth greater than said emitter region.

27. A high voltage lateral bipolar transistor according to claim 26, wherein said high impurity concentration region has a greater depth than said collector region.

28. A high voltage lateral bipolar transistor according to claim 26, wherein said collector region has a greater depth than said high impurity concentration region.

29. A high voltage lateral bipolar transistor according to claim 25, wherein said base region has a Gaussian impurity profile.

30. A high voltage lateral bipolar transistor according to claim 25, wherein said high impurity concentration region is a substantially constant impurity concentration region formed along the surface of a substantially constant impurity concentration low impurity region.

31. A high voltage lateral bipolar transistor according to claim 25, wherein said field plate extends from said collector across a substantial portion of said base region between said collector and emitter regions.

32. A vertical bipolar transistor comprising:
a collector region of a first conductivity type, having a surface and a collector contact region in said surface;
a base region of a second conductivity type in said surface;
an emitter region of said first conductivity type in said surface and base region;
a field plate separated from said surface by an insulative layer and extending from said base region across said collector region;

the impurity concentration of said collector region decreases from said surface, having a high impurity concentration region at said surface and extending down along a substantial portion of the depth of said base region greater than the depth of and having a higher charge density than a surface accumulation region and a low impurity concentration region adjacent the bottom of said base region so that said high impurity concentration region under said field plate is depleted by biasing said field plate before a critical field is reached in the portion of said high impurity concentration region under said field plate.

33. A vertical bipolar transistor according to claim 32, wherein said high impurity concentration region has a greater depth than said base region.

34. A vertical bipolar transistor according to claim 32, wherein said collector region has a Gaussian impurity profile.

35. A vertical bipolar transistor according to claim 32, wherein said high impurity concentration region is a substantially constant impurity concentration region formed along the surface of a substantially constant impurity concentration low impurity region.

36. A vertical bipolar transistor according to claim 32, including a base contact having a portion extending over said high impurity concentration region and acting as a field plate and wherein said field plate is spaced from said base contact field plate portion and extends over a substantial portion of said high impurity concentration region between said base and collector contact.

37. In a dielectrically isolated integrated circuit having semiconductor islands of a first conductivity type separated from and in the surface of a semiconductror support by a dielectric layer, a conductor separated by a top insulative layer from and traversing adjacent portions of the top surface of at least one of said semiconductor islands and said semicoductor support, the improvement comprising:
the impurity concentration of said semiconductor island decreasing from said top surface having a high impurity concentration region at said top surface and extending down a substantial portion of the depth of said island and a low impurity concentration region adjacent the bottom of said island so that said high impurity concentration region under said conductor is depleted by biasing said conductor before a critical field is reached in the portion of said high impurity concentration region under said conductor.

* * * * *